United States Patent [19]
Amberg et al.

[11] Patent Number: 6,075,704
[45] Date of Patent: Jun. 13, 2000

[54] INPUT/OUTPUT BUS SYSTEM IN A TOWER BUILDING BLOCK SYSTEM

[75] Inventors: Mark Frederick Amberg, Littleton; Frank Michael Nemeth, Colorado Springs, both of Colo.

[73] Assignee: Digital Equipment Corporation, Houston, Tex.

[21] Appl. No.: 08/884,777

[22] Filed: Jun. 30, 1997

[51] Int. Cl.[7] .............................. H05K 1/14; H05K 1/11; H01R 9/09
[52] U.S. Cl. .......................... 361/736; 361/729; 361/792; 361/803; 361/785; 439/74
[58] Field of Search .................................... 361/728, 729, 361/730, 735, 736, 784, 785, 790, 791, 792, 803, 752; 439/259, 294, 347, 74

[56] References Cited

U.S. PATENT DOCUMENTS

| | | | |
|---|---|---|---|
| 4,401,351 | 8/1983 | Record | 361/735 X |
| 4,558,914 | 12/1985 | Prager et al. | 31/729 X |
| 5,097,388 | 3/1992 | Buist et al. | 361/729 X |
| 5,645,434 | 7/1997 | Leung | 439/74 |

*Primary Examiner*—Donald Sparks
*Assistant Examiner*—Jayprakash N. Gandhi
*Attorney, Agent, or Firm*—William J. Kubida; Hogan & Hartson LLP

[57] ABSTRACT

In a modular tower building block system for containing computing system devices, an I/O bus is incorporated into the modular blocks of the building block system by using a printed circuit board to carry the I/O bus in each modular block. The printed circuit board is mounted and positioned in each modular block to electrically connect with a printed circuit board in a next adjacent modular block when two modular blocks are stacked on each other. Also, there are a plurality of I/O buses on the printed circuit boards and only one I/O bus is distributed from each modular block. The printed circuit board is precisely located in each modular block at a predetermined position. Alignment pins and receivers provide alignment between stacked modular blocks to precisely position one modular block to the other modular block. This also aligns electrical connectors on the printed circuit boards of the stacked blocks so that the connectors on the printed circuit boards from two blocks mate when the two blocks are stacked.

3 Claims, 5 Drawing Sheets

INPUT/OUTPUT BUS SYSTEM IN A TOWER BUILDING BLOCK SYSTEM

CROSS-REFERENCE TO RELATED APPLICATIONS

The following copending, commonly-assigned patent applications describe a tower building block system for storing computing system devices. The tower building block system is used with a preferred embodiment of the present invention. The applications are hereby incorporated by reference.

1. "Tower Building Block System" invented by Mark Amberg et al, U.S. patent application Ser. No. 08/884,986 filed Jun. 30, 1997, now U.S. Pat. No. 5,897,400.

2. "Power Bus System In A Tower Building Block System" invented by Mark Amberg et al, U.S. patent application Ser. No. 08/884,938 filed Jun. 30, 1997.

BACKGROUND OF THE INVENTION

1. Field of the Invention

This invention relates to an input/output bus in a tower containing computing system devices. More particularly, this invention relates to the design of such a bus as integrated into building blocks used to build the tower.

2. Description of the Related Art

Modular towers for storing computing system devices offer the advantage of providing only exactly the amount of space required to contain the computing system devices. As more devices are added, a module of the tower is added to accommodate the additional device.

An on-going problem towers, racks or cabinets that contain computing system devices is the plurality of input/output cables of different lengths that are required to interconnect the devices. The cables are unwieldy and difficult to fit into the tower. The cables are often the wrong, length for the required connection. In order to reconfigure the physical layout of the computing system, the user may have to replace many cables. To be able to physically change or add to the system the user may have many unused cables in inventory. This is expensive and a further waste of space in storing unused equipment.

A modular tower system provides the ability to adjust the physical size of the computing system to the amount of storage space required to store the computing system devices. What is needed is a solution to the above problems of interconnecting the computing system devices on a bus.

SUMMARY OF THE INVENTION

In accordance with this invention, the above problems in a modular tower system containing computing system devices by incorporating the input/output bus into the modules of the tower system. In a modular tower building block system, the I/O bus is incorporated into modular blocks of the building block system by using a printed circuit element to carry the I/O bus in each modular block. The printed circuit element is mounted and positioned in each module to electrically connect with a printed circuit element in a next adjacent modular block when two modular blocks are positioned adjacent to each other.

As another feature of the invention, there are a plurality of I/O buses on the printed circuit elements, and only one I/O bus is distributed from each modular block. In yet a further feature of the invention, the printed circuit element is precisely located in each modular block at a predetermined position relative to alignment positioning elements in the modular block. The positioning elements provide alignment between adjacent modular blocks to precisely position one modular block adjacent the other modular block. At the same time, this aligns the printed circuit elements of the adjacent blocks for connection from the printed circuit element in one modular block to the printed circuit element in the other modular block.

The great advantage and utility of the present invention is the I/O bus is incorporated into the building block system. Accordingly, when building blocks are assembled to accommodate more computing system devices, additional I/O bus is provided at the same time. The foregoing and other features, utilities and advantages of the invention will be apparent from the following more particular description of a preferred embodiment of the invention as illustrated in the accompany drawings.

DETAILED DESCRIPTION OF PREFERRED EMBODIMENTS

Figure 1:
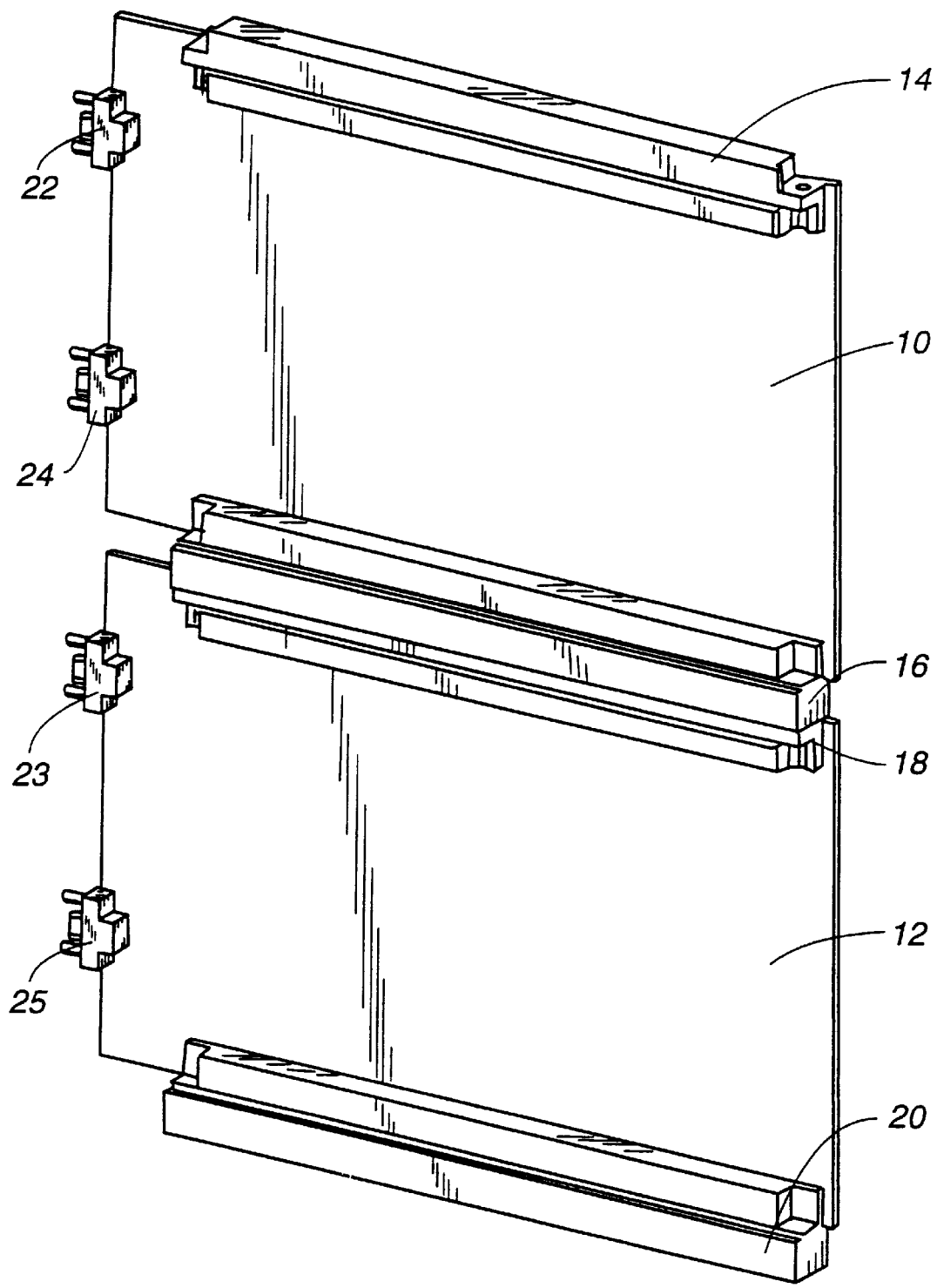
FIG. 1 shows two printed circuit boards interconnected to implement a preferred embodiment of the invention where I/O buses are passed up the tower building block system.

In FIG. 1, the modularized I/O bus in the preferred embodiment is placed on a printed circuit board. Two printed circuit boards 10 and 12 are shown in FIG. 1. Each printed circuit board has a female connector at the top and a male connector at the bottom. The male connector has a conductive shroud mounted around the pins to provide EMI shielding at the connector. Thus, the pins are not visible in FIG. 1. Female connector 14 (pin receptacles also not shown) is at the top of printed circuit board 10, while male connector 16 is at the bottom of printed circuit board 10. Similarly, female connector 18 is at the top of printed circuit board 12 and male connector 20 is at the bottom of printed circuit board 12. Printed circuit board 10 is connected to printed circuit board 12 through male connector 16 and female connector 18.

Each printed circuit board card will be mounted in a module or building block of the tower building block system. Accordingly, when the building blocks were connected together, the connectors would mate, as shown in FIG. 1, between connectors 16 and 18. The alignment for obtaining proper mating of the connectors will be described hereinafter. At the side of the printed circuit boards 10 and 12 are individual I/O bus connectors. Connectors 22 and 23 are the up-tower connectors for boards 10 and 12, respectively. Connectors 24 and 25 are the down-tower connectors for boards 10 and 12, respectively. These connectors would connect to the input/output bus for the computing system devices mounted in that shelf level of the building block and then pass the I/O bus up-tower or down-tower, as will be described hereinafter.

As described in the related applications, the tower building block system has two towers with a shelf of computing system devices mounted between blocks at the same level in the two towers. In the building blocks of one tower, are mounted the input/output bus printed circuit boards. In the building blocks of the second tower, are mounted the power bus printed circuit boards.

Figure 2:
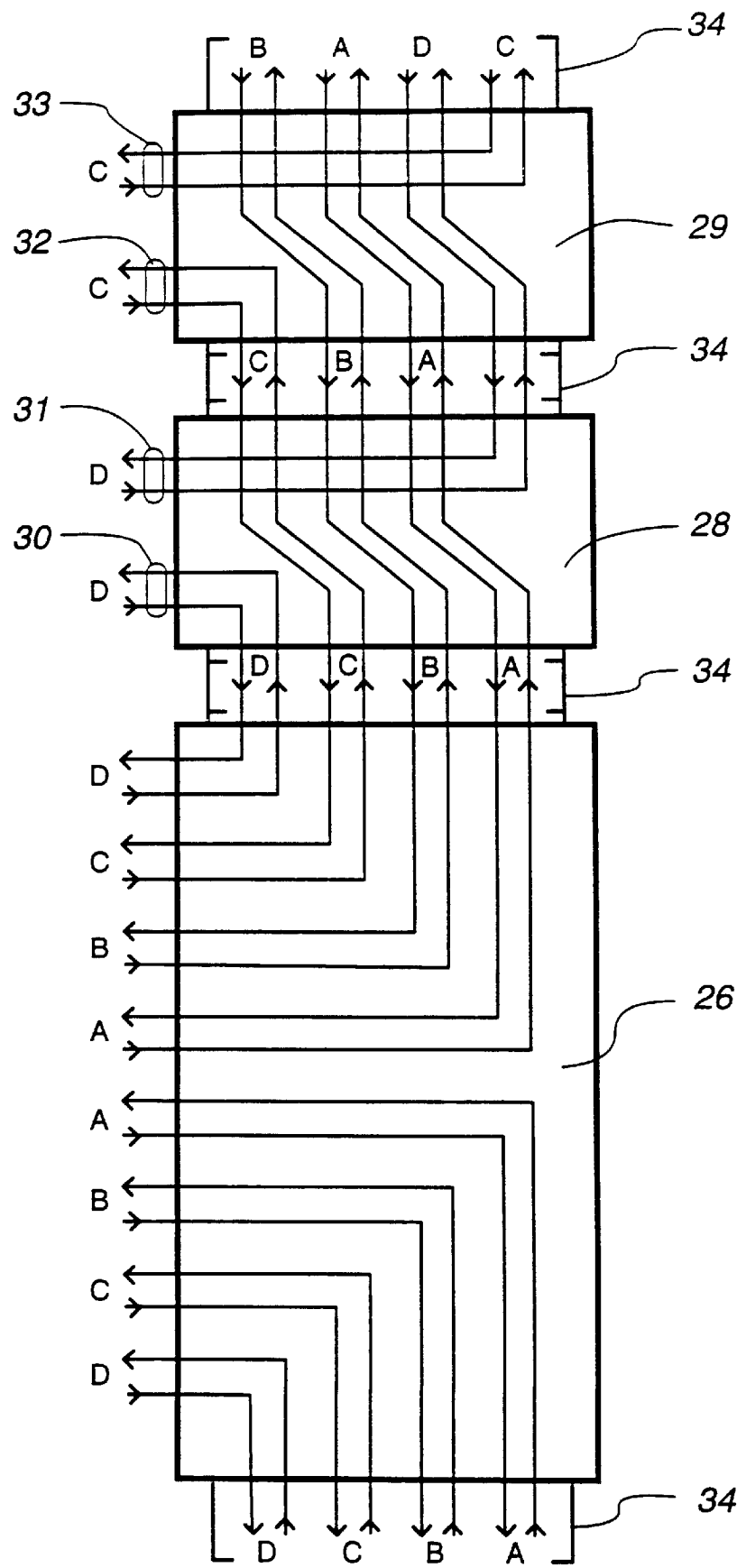
FIG. 2 shows the bus layout on an output I/O printed circuit board and two transport I/O printed circuit boards connected to pass the I/O buses up the tower.

There are two types of I/O bus printed circuit boards. Both types of printed circuit boards are shown in FIG. 2. Printed circuit board 26 is an output I/O printed circuit board and boards 28 and 29 are transport I/O printed circuit boards. In the embodiment in FIG. 2, there are four I/O buses shown on the Printed Circuit Board (PCBs). The number of input/output buses on the PCBs is controlled by the capacity of the boards and the connectors; i.e., the number of pins in the connectors and the available real estate on the boards.

Figure 3:
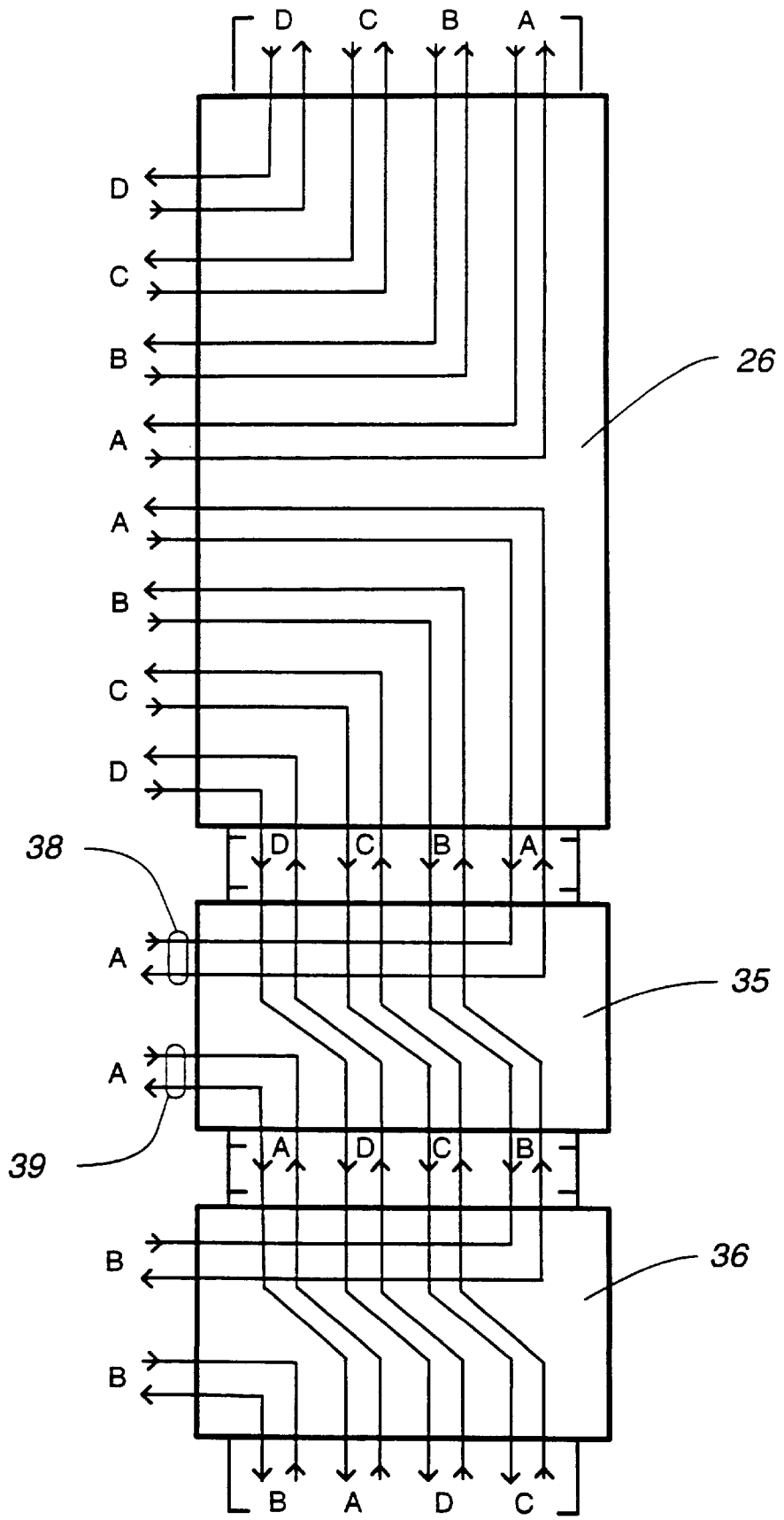
FIG. 3 shows the bus layout on an output I/O printed circuit board and two transport I/O printed circuit boards connected to pass the I/O buses down the tower.

The output I/O PCB 26 has the capability of connecting four buses, A, B, C and D, to transport cards up the tower from PCB 26, as shown with transport cards 28 and 29, or to transport cards down the tower, as shown in FIG. 3 described hereinafter. Connections of the A, B, C, D buses exiting to the left of the card 26 in FIG. 2 would go to controllers or initiators. Buses A, B, C, D at the top of the output I/O PCB 26 would go through connectors such as 16 and 18 shown in FIG. 1 to the first transport I/O PCB 28.

The bus pattern on each of the transport I/O PCBs physically shifts the bus left one position for each transport PCB as the bus moves up the tower. At PCB 28, the "D" bus exits at connector 30 to computing system devices at that shelf. If the "D" bus is to continue upward, the bus is reconnected at connector 31 to proceed up the tower. In each transport PCB, the left-most lower bus is the path down the tower, and the right-most uppermost connection is the path up the tower.

In transport I/O PCB 29, "C" bus is exiting at connector 32 to the shelf at the level of the tower block containing PCB 29 and is returning at "C" bus connector 33 to go up-tower. The brackets 34 around the bus connectors represent the EMI shield, or shroud, previously described in FIG. 1. For each of the PCBs, the connector at the top of the board is the female connector and the connector at the bottom of the board is the male connector also as previously described in FIG. 1.

FIG. 3 shows transport I/O PCBs 35 and 36 connected down tower from the output I/O PCB 26. The circuit layout of PCBs 35 and 36 in FIG. 3 is identical, of course, to the circuit layout in PCBs 28 and 29 in FIG. 2. However, because the buses are now proceeding down tower, relative to the output PCB 26, the buses shift to the right as they travel through each transport I/O PCB.

In transport PCB 35, which is immediately below the output PCB 26, the "A" bus goes out connector 38 to the shelf at that building block level and returns to connector 39 to go further down the tower if desired. At the next lower modular building block level containing transport I/O PCB 36, the "B" bus exits and returns to the PCB card. In the manner just described for FIGS. 2 and 3, the A, B, C, D buses may be passed up and down tower until enough computing system devices have been attached to the buses to fill the capacity of each of the buses. Of course, the advantage of the building block tower and the modular incorporated I/O bus is that building blocks or modules with their incorporated PCB may be added to the tower as necessary to add more computing devices until the capacity of each bus is met.

Each of the PCB in FIGS. 2 and 3 are installed in a tower building block as described in the co-pending commonly assigned application entitled "Tower Building Block System." All PCBs are sized to match the height of the building block. Typically, all PCBs are the same size although for convenience of illustrating the circuit layout, PCB 26 in FIGS. 2 and 3 were shown larger than the transport I/O PCBs. Of course, if the controller shelf, where the output I/O PCB is used, has a different height to accommodate the controller or other computing system devices, then the building block and its output I/O PCB for that shelf would have heights to match that required by the controller. Alternatively, the building blocks and PCBs would be one standard size and more than one building block would be stacked to accommodate a computing system device taller than one building block.

The connectors used with the PCB are not self-aligning connectors. Instead, the PCBs are precisely mounted in the building blocks and building blocks themselves have guide pins and receiving holes. These guide pins and receiving holes guide the tower building blocks into place and, at the same time, guide the mating of the connectors for the PCBs mounted in the building blocks. Double connectors, male and female, have been shown. Alternatively, printed circuit board edge connectors could be used.

Figure 4:
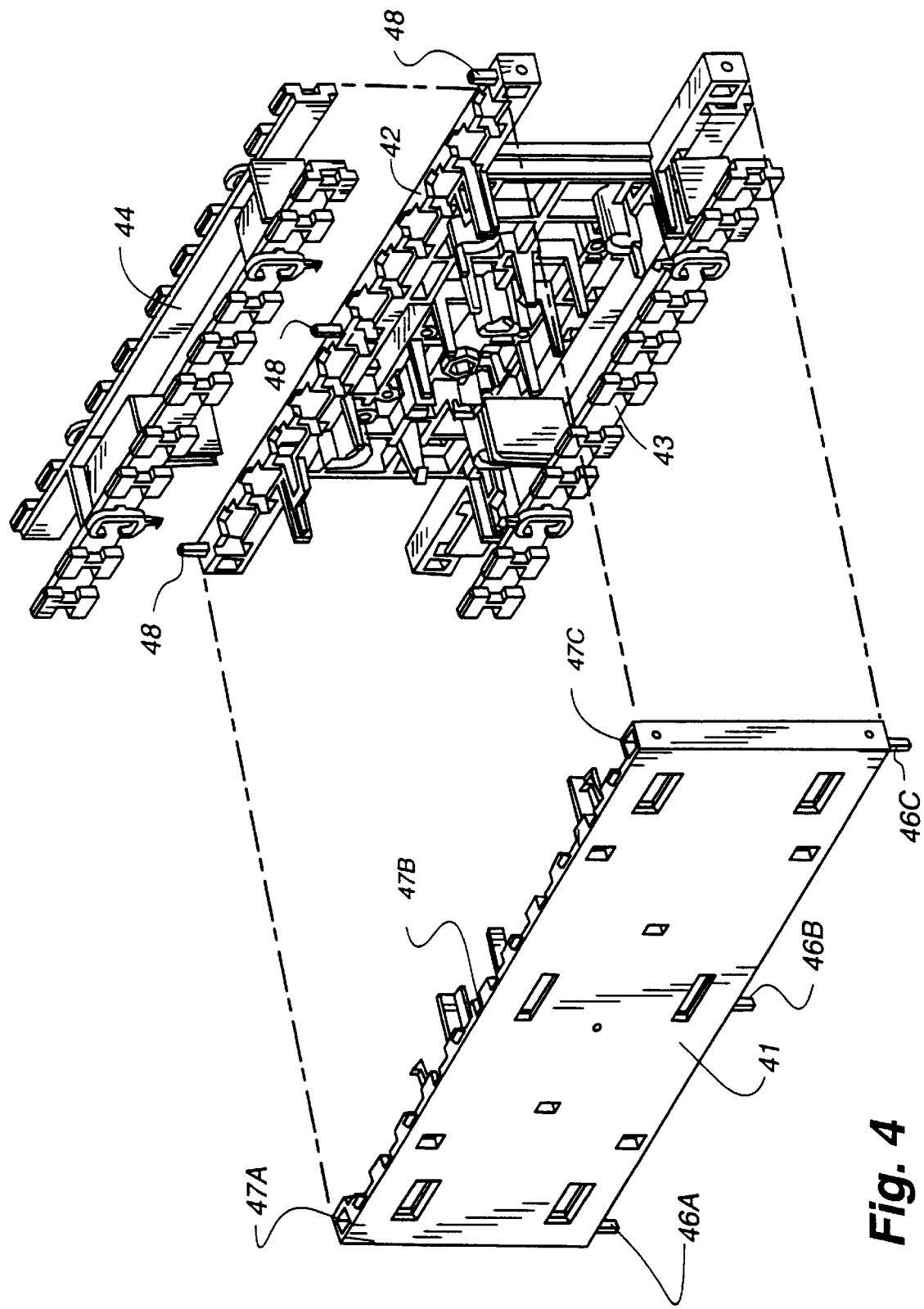
FIG. 4 shows a alignment pins and receivers in a tower building block into which an I/O bus printed circuit board is mounted.

FIG. 4 shows one tower building block with an upper latch element and a lower latch element to fasten the building block to the next higher or lower block respectively. The building block is made up of walls 41 and 42 which are shown exploded apart in FIG. 4. Lower latch element 43 is shown fastened to wall 42. Upper latch element 44 is shown above wall 42. Before walls 41 and 42 are snapped together to form a tower building block, either latch element 43 or 44 is secured, and an I/O printed circuit board is fastened to wall 42 at a precise location.

Figure 5:
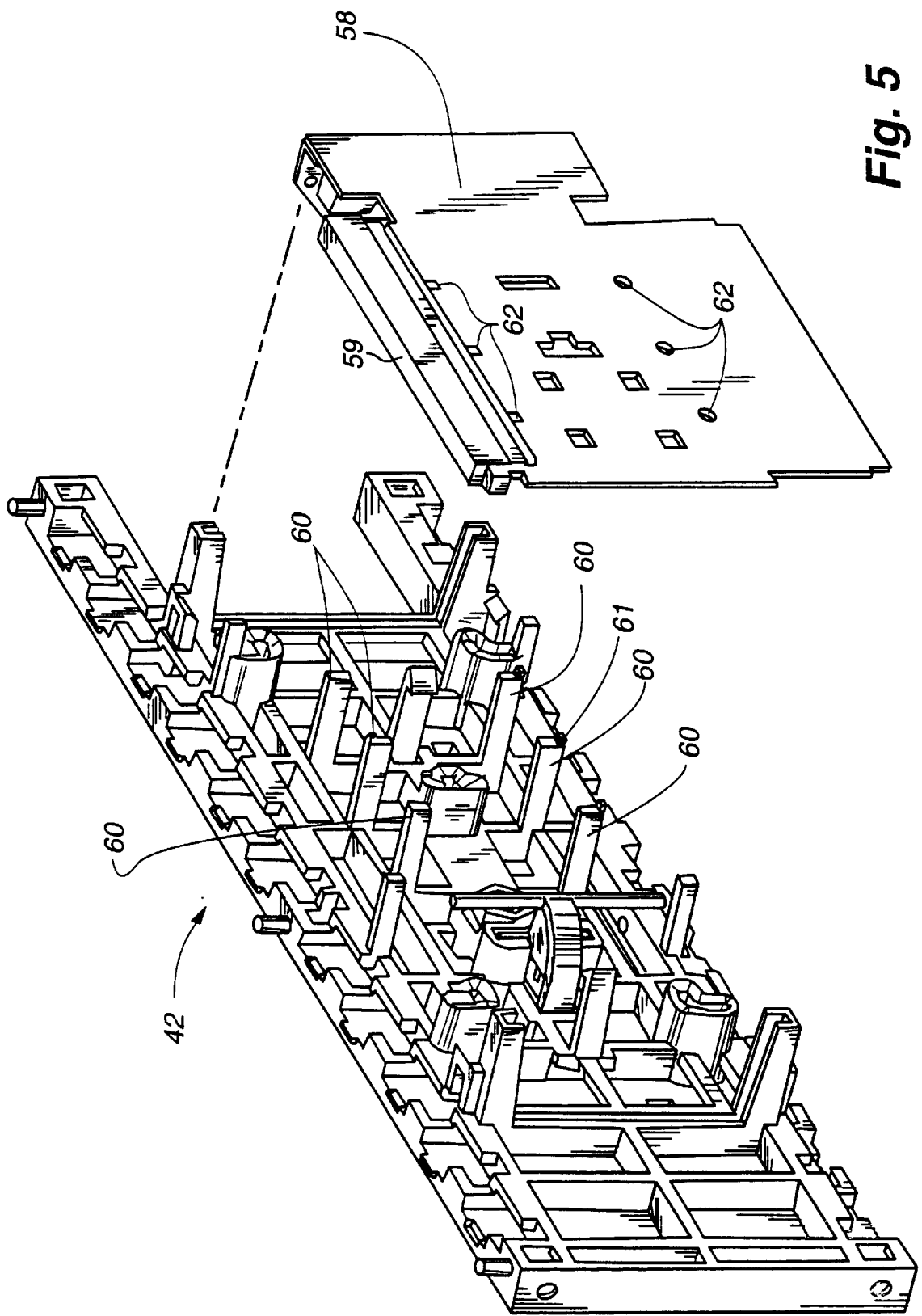
FIG. 5 shows a printed circuit board and posts on one wall of the building block for precisely locating the printed circuit board.

FIG. 5 shows an I/O printed circuit board 58 exploded away from wall 42 of the building block. Printed circuit board 58 is attached to posts 60 molded into wall 42. Printed circuit board 58 is using a board edge type of electrical connector 59. Posts 60 have small registration posts 61 or pins at there tops that engage holes 62 in printed circuit board 58. The registration posts 61 snap into holes 62, or alternatively serve to register the position of PCB 58 in place until spacers from wall 41 hold PCB 58 in place when the walls 41 and 42 fasten together. In any case, posts 60 with registration posts 61 engaging holes 62 serve to precisely locate PCB 58 relative to alignment posts and receivers on the walls 41 and 42 of the building block.

In FIG. 4, wall 41 of the building block has alignment posts or pins 46A, 46B and 46C at the bottom of wall 41. The top of wall 41 has alignment receiving holes 47A and 47C and receiving slot 47B. Similar alignment posts and alignment receivers are on wall 42. However, the alignment posts are at the top of wall 42, and the alignment receivers are at the bottom of wall 42. Only alignment posts 48 are visible for wall 42.

When one building block is stacked on the next lower building block, then alignment posts 46 of wall 41 in the upper block engage alignment receivers 47 in the lower block. Likewise, alignment pins 48 of wall 42 in the lower block engage alignment receivers in the upper block. In this way, two blocks are physically mated. The alignment posts and alignment receivers, either or both, have tapered surfaces to assist the initial alignment and mating of the posts in the receivers.

At the same time, since board 58 is precisely positioned in each building block, the edge connector 59 of board 58 in the lower building block will be properly aligned with the edge of the board 58 in the upper building block. Thus, the electrical connection also is aligned and mated so that the electrical connection between boards is made. If male and female connectors are used as in FIG. 1, the male connector is at the bottom of board 58 and the female connector is at the top of board 58. The connectors are guided into alignment by alignment posts and alignment receivers on the walls of the building blocks.

After, the building blocks are physically mated by vertical movement of one block onto the other block, the latch element 43 slides horizontally to fasten and hold the stacked blocks together. The tower building blocks and the mechanism for stacking the building blocks is described in detail in cross-referenced co-pending patent application entitled "Tower Building Block System."

While a plurality of embodiments for implementing the invention have been described, it will be appreciated that any number of additional variations or alterations in the elements used to implement the invention may be made and are within the scope of the invention as claimed hereinafter.

We claim:

1. In a modular tower for storing tandemly-positioned computing system devices at modular blocks of the modular tower, an input/output (I/O) bus assembly connectable to the computing system devices contained at the modular blocks, said I/O bus assembly comprising:

a plurality of printed circuit boards, each positioned at one of the modular blocks of the modular tower, each printed circuit board defining a top edge surface, a bottom edge surface, and a side edge surface, the top edge surface of one of the printed circuit boards positioned at a first one of the modular blocks abutting with the bottom edge surface of another of the printed circuit boards positioned at a next adjacent one of the modular blocks;

a plurality of bus lines formed to extend along the printed circuit boards positioned at each of the modular blocks, a bus line of said plurality of bus lines extending to the side edge surface of each printed circuit board to be distributed therefrom and other bus lines of said plurality of bus lines extending between the bottom edge surface and the top edge surface of each printed circuit board; and an edge connector for connecting together portions of the plurality of bus lines formed at the top edge surface of one of the printed circuit boards with portions of the plurality of bus lines formed at the bottom edge surface of another of the printed circuit boards positioned at the next adjacent one of the modular blocks.

2. The I/O bus assembly of claim 1 wherein only one I/O bus line is distributed from each modular block.

3. The I/O bus assembly of claim 1 wherein:

each printed circuit board is precisely located at a predetermined position at a modular block; and wherein said I/O bus assembly further comprises positioning elements providing alignment between adjacent modular blocks to precisely position one modular block adjacent the other modular block and thereby connect a printed circuit element in said one modular block to the printed circuit element in the other modular block.

* * * * *